United States Patent
Lee

(10) Patent No.: US 10,984,851 B2
(45) Date of Patent: Apr. 20, 2021

(54) MEMORY SYSTEM AND METHOD FOR OPERATING THE SAME

(71) Applicant: SK hynix Inc., Icheon (KR)

(72) Inventor: Jong-Min Lee, Seoul (KR)

(73) Assignee: SK hynix Inc., Icheon (KR)

( * ) Notice: Subject to any disclaimer, the term of this patent is extended or adjusted under 35 U.S.C. 154(b) by 29 days.

(21) Appl. No.: 16/694,908

(22) Filed: Nov. 25, 2019

(65) Prior Publication Data

US 2020/0310909 A1 Oct. 1, 2020

(30) Foreign Application Priority Data

Mar. 25, 2019 (KR) .................. 10-2019-0033510

(51) Int. Cl.
| | | |
|---|---|---|
| *G11C 11/409* | (2006.01) | |
| *G11C 11/10* | (2006.01) | |
| *G06F 11/10* | (2006.01) | |
| *G11C 11/408* | (2006.01) | |
| *G11C 29/10* | (2006.01) | |
| *G06F 11/07* | (2006.01) | |

(52) U.S. Cl.
CPC .......... *G11C 11/409* (2013.01); *G06F 11/076* (2013.01); *G06F 11/102* (2013.01); *G06F 11/1004* (2013.01); *G11C 11/4085* (2013.01); *G11C 29/10* (2013.01)

(58) Field of Classification Search
CPC .. G06F 11/102; G06F 11/076; G06F 11/1004; G11C 16/06; G11C 11/409; G11C 11/4085
See application file for complete search history.

(56) References Cited

U.S. PATENT DOCUMENTS

| | | | | |
|---|---|---|---|---|
| 2013/0145082 A1* | 6/2013 | Tamagawa | ............ | G06F 3/0604 711/103 |
| 2017/0330635 A1* | 11/2017 | Shepard | ................. | G11C 16/06 |
| 2019/0294358 A1* | 9/2019 | Suzuki | ................. | G06F 3/0611 |

FOREIGN PATENT DOCUMENTS

| | | |
|---|---|---|
| KR | 101450396 B1 | 10/2014 |
| KR | 1020150107401 A | 9/2015 |
| KR | 101615907 B1 | 4/2016 |
| KR | 1020160055723 A | 5/2016 |
| KR | 101639672 B1 | 7/2016 |

* cited by examiner

*Primary Examiner* — Shelly A Chase

(57) ABSTRACT

A memory system includes: a memory device; and a controller suitable for performing a first test read operation on a first plurality of candidate memory blocks, determining a test read method of a second test read operation based on a reference value and a first number of the first plurality candidate memory blocks scanned in the first test read operation, and performing the second test read operation on a second plurality of candidate memory blocks based on the determined test read method.

20 Claims, 5 Drawing Sheets

MEMORY SYSTEM AND METHOD FOR OPERATING THE SAME

CROSS-REFERENCE TO RELATED APPLICATION

The present application claims priority to Korean Patent Application No. 10-2019-0033510, filed on Mar. 25, 2019, which is incorporated herein by reference in its entirety.

BACKGROUND

1. Field

Embodiments of the present disclosure relate to a memory system and a method for operating the memory system, and more particularly, to a memory system capable of improving data processing efficiency, and a method for operating the memory system.

2. Description of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Such memory systems may have excellent stability and durability, a high information access speed, and low power consumption. Examples of these memory systems include universal serial bus (USB) memory devices, memory cards having various interfaces, and solid state drives (SSD).

SUMMARY

Embodiments of the present disclosure are directed to a memory system that may efficiently manage memory blocks.

In accordance with an embodiment of the present invention, a memory system includes: a memory device; and a controller suitable for performing a first test read operation on a first plurality of candidate memory blocks, determining a test read method of a second test read operation based on a reference value and a first number of the first plurality of candidate memory blocks scanned in the first test read operation, and performing a second test read operation on a second plurality of candidate memory blocks based on the determined test read method.

In accordance with another embodiment of the present invention, a method for operating a memory system includes: counting a first number of a first plurality of candidate memory blocks scanned in a first test read operation; determining a test read method of a second test read operation based on a reference value and the first number of the first plurality of candidate memory blocks scanned in the first read operation; and performing the second test read operation on a plurality of candidate memory blocks based on the determined test read method.

DETAILED DESCRIPTION

Figure 1:
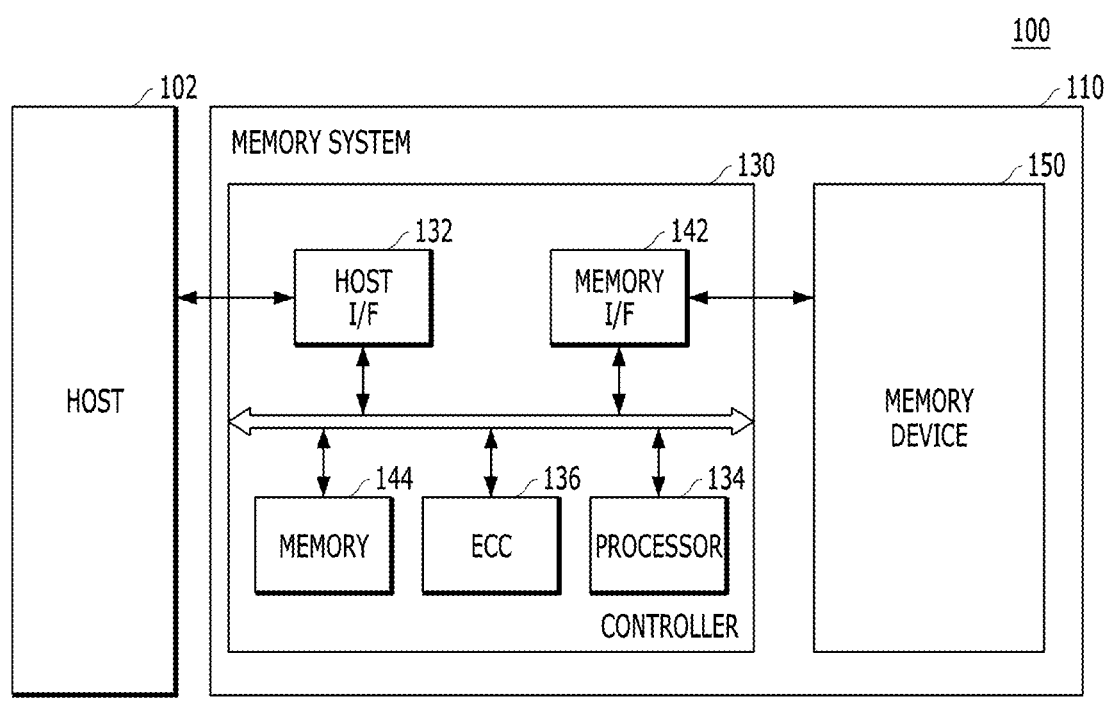
FIG. 1 is a block diagram illustrating a data processing system including a memory system in accordance with an embodiment of the present disclosure.

Embodiments of the present disclosure will be described below in more detail with reference to the accompanying drawings. Embodiments of the present disclosure may, however, be embodied in different forms and should not be construed as limited to the embodiments set forth herein. Rather, these embodiments are provided so that this disclosure will be thorough and complete, and will fully convey the scope of various embodiments of the present disclosure to those skilled in the art. Throughout the disclosure, like reference numerals refer to like parts throughout the various figures and embodiments of the present disclosure.

FIG. 1 is a block diagram illustrating a data processing system 100 in accordance with an embodiment of the present disclosure.

Referring to FIG. 1, the data processing system 100 may include a host 102 operatively coupled to a memory system 110.

The host 102 may include any of various portable electronic devices such as a mobile phone, an MP3 player, and a laptop computer, or any of various non-portable electronic devices such as a desktop computer, a game machine, a television (TV), and a projector.

The host 102 may include at least one operating system (OS), which may manage and control overall functions and operations of the host 102, and control an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card, and a memory stick. The MMC may include an embedded MMC (eMMC), reduced size MMC (RS-MMC), micro-MMC, and the like. The SD card may include a mini-SD card and micro-SD card.

The memory system 110 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM), and a flash memory. The flash memory may have a 3-dimensional (3D) stack structure.

The memory system 110 may include a controller 130 and a memory device 150.

The controller 130 and the memory device 150 may be integrated into a single semiconductor device. For example, the controller 130 and the memory device 150 may be integrated as a single semiconductor device to constitute a solid state drive (SSD). When the memory system 110 is used as an SSD, the operating speed of the host 102 connected to the memory system 110 can be improved. In addition, the controller 130 and the memory device 150 may be integrated as a single semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

Meanwhile, the memory device 150 in the memory system 110 may retain the stored data even when power supply is cut off, and in particular, may store data provided from the host 102 through a write operation and provide the host 102 with the stored data through a read operation. Herein, the memory device 150 may include a plurality of memory blocks, each of which includes a plurality of pages, each of which includes a plurality of memory cells that are respectively coupled to a plurality of word lines. In an embodiment, the memory device 150 may include a plurality of memory dies, each of which includes a plurality of planes, each of which includes a plurality of memory blocks. The memory device 150 may be a non-volatile memory device, e.g., a flash memory, wherein the flash memory may have a three-dimensional stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program, and erase operations of the memory device 150.

The controller 130 may include a host interface (I/F) 132, a processor 134, an error-correcting code (ECC) component 136, a memory I/F 142, and a memory 144. Although not illustrated in FIG. 1, the controller 130 may further include a power management unit capable of providing and managing the power of the constituent elements included in the controller 130.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI), and integrated drive electronics (IDE).

The host I/F 132 may be driven through firmware referred to as a host interface layer (HIL) in order to exchange data with the host 102.

The ECC component 136 may correct the failure bit of data processed in the memory device 150, and the ECC component 138 may include an ECC encoder and an ECC decoder.

The ECC encoder may perform an error correction encoding operation on the data to be programmed in the memory device 150 so as to generate data with a parity bit added thereto. The data with the added parity bit may be stored in the memory device 150. The ECC decoder may detect and correct a failure bit included in the data which is read from the memory device 150 when reading the data stored in the memory device 150.

The ECC component 136 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM), and Block coded modulation (BCM). However, the ECC component 136 is not limited to any specific structure. The ECC component 136 may include any of circuits, modules, systems, and devices for error correction.

The processor 134 may control overall operations of the memory system 110. The processor 134 may drive firmware to control the overall operations of the memory system 110. The firmware may be referred to as flash translation layer (FTL). In an embodiment, the processor 134 may be realized as a microprocessor or a central processing unit (CPU).

Also, the controller 130 may perform a background operation onto the memory device 150 through the processor 134, which is realized as a microprocessor or a CPU. For example, the background operation performed onto the memory device 150 may include a garbage collection (GC) operation, a wear-leveling (WL) operation, a map flush operation, or a bad block management operation.

The memory 144 may serve as a working memory of the memory system 110 and the controller 130, and store data for driving the memory system 110 and the controller 130.

The memory 144 may be embodied by a volatile memory. For example, the memory 144 may be embodied by static random access memory (SRAM) or dynamic random access memory (DRAM). The memory 144 may be disposed within or outside the controller 130. FIG. 1 shows the memory 144 disposed within the controller 130. In another embodiment, the memory 144 may be disposed outside the controller 130 and embodied by an external volatile memory having a memory interface transferring data between the memory 144 and the controller 130.

As described above, the memory 144 may store data required for performing a data write/read operation between the host 102 and the memory device 150 as well as data on which the data write/read operation is performed. In order to store such data, the memory 144 may include a program memory, data memory, write buffer/cache, read buffer/cache, data buffer/cache, map buffer/cache, or the like.

Figure 2:
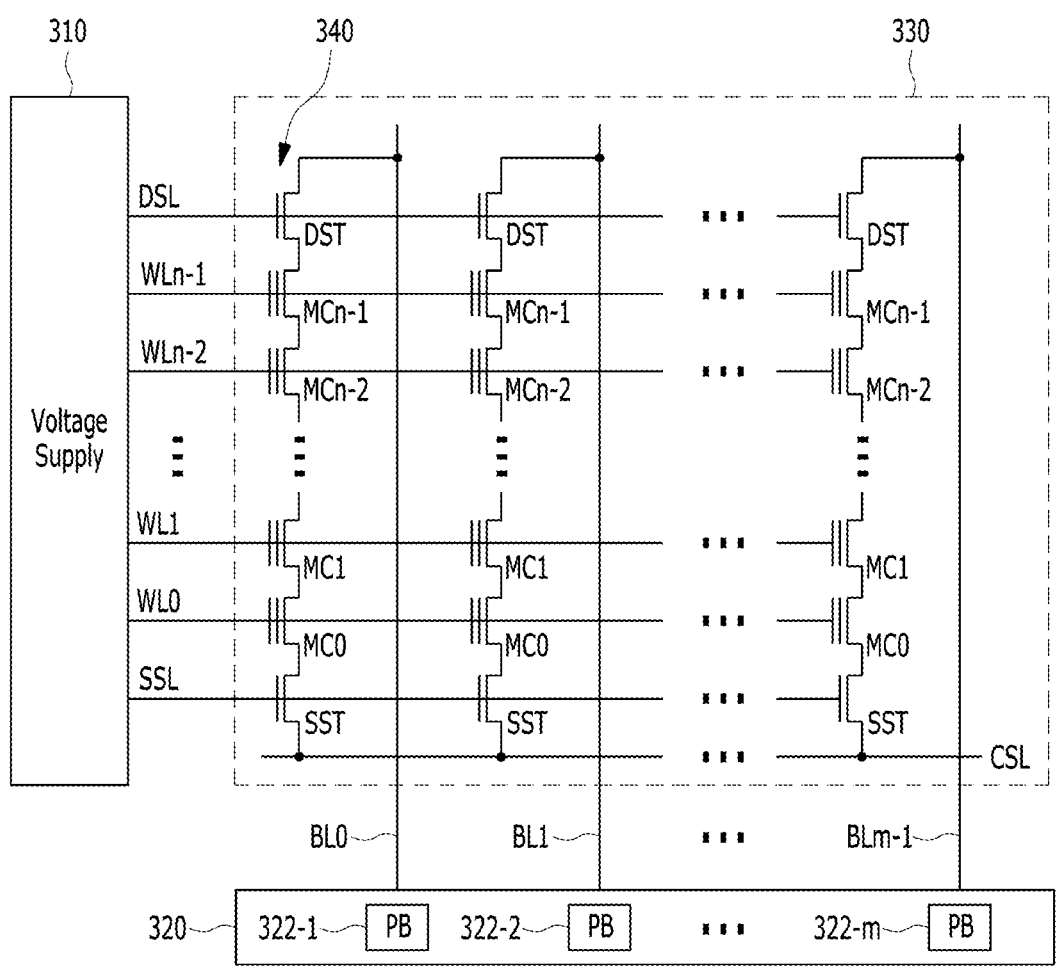
FIG. 2 is a schematic diagram illustrating an example configuration of a memory device employed in the memory system of FIG. 1.

FIG. 2 is a schematic diagram illustrating the memory device 150 according to an embodiment.

Referring to FIG. 2, the memory device 150 may include a plurality of memory blocks (e.g., a memory block 330). Each of the memory blocks may include a plurality of pages, for example $2^M$ pages, the number of which may vary according to embodiments. For example, each of the memory blocks may include M pages. Each of the pages may include a plurality of memory cells that are coupled to a word line.

The memory device 150 may include single-level cell (SLC) memory blocks. In an embodiment, the memory device 150 may include various multi-level cell (MLC)

memory blocks, for example, multi-level cell (MLC) memory blocks each including a plurality of pages that are realized by memory cells capable of storing two-bit data in one memory cell, triple-level cell (TLC) memory blocks each including a plurality of pages that are realized by memory cells capable of storing three-bit data in one memory cell, quad-level cell (QLC) memory blocks each including a plurality of pages that are realized by memory cells capable of storing four-bit data in one memory cell, and other types of memory blocks each including a plurality of pages that are realized by memory cells capable of storing five or more-bit data in one memory cell.

In accordance with an embodiment of the present disclosure, the memory device 150 is described as a non-volatile memory, such as a flash memory, e.g., a NAND flash memory. However, embodiments of the present disclosure are not limited thereto, and the memory device 150 may be realized as any of a Phase Change Random Access Memory (PCRAM), a Resistive Random Access Memory (RRAM or ReRAM), a Ferroelectric Random Access Memory (FRAM), and a Spin Transfer Torque Magnetic Random Access Memory (STT-RAM or STT-MRAM).

The memory block 330 included in the memory device 150 of the memory system 110, may include a plurality of cell strings 340 coupled to a plurality of bit lines BL0 to BLm-1, respectively. The cell string of each column may include one or more drain select transistors DST and one or more source select transistors SST. Between the drain and source select transistors DST and SST, a plurality of memory cells (or memory cell transistors) MC0 to MCn-1 may be coupled in series. In an embodiment, each of the memory cells MC0 to MCn-1 may be embodied by an MLC capable of storing data information of a plurality of bits. Each of the cell strings 340 may be electrically coupled to a corresponding bit line among the plurality of bit lines BL0 to BLm-1. For example, the first cell string is coupled to the first bit line BL0, and the last cell string is coupled to the last bit line BLm-1.

Although FIG. 2 illustrates NAND flash memory cells, embodiments of the disclosure are not limited thereto. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides one or more word line voltages (e.g., a program voltage, a read voltage, and a pass voltage) to the word lines WL0 to WLn-1 according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines.

The memory device 150 may include a read and write (read/write) circuit 320 which is controlled by the control circuit. During a verification/normal read operation, the read/write circuit 320 may function as a sense amplifier for reading data from the memory cell array. During a program operation, the read/write circuit 320 may function as a write driver for driving bit lines according to data to be stored in the memory cell array. During a program operation, the read/write circuit 320 may receive data to be stored into the memory cell array from a buffer (not illustrated), and drive bit lines according to the received data. The read/write circuit 320 may include a plurality of page buffers 322-1 to 322-m respectively corresponding to columns (or bit lines) or column pairs (or bit line pairs), and each of the page buffers 322-1 to 322-m may include a plurality of latches (not illustrated).

The memory device 150 may be embodied by a two-dimensional (2D) or three-dimensional (3D) memory device. For example, the memory device 150 may be implemented as a nonvolatile memory device having a 3D stack structure. When the memory device 150 has a 3D structure, the memory device 150 may include a plurality of memory blocks.

Each memory block 330 included in the memory device 150 may include a plurality of NAND strings 340 each extending in a first direction. In an embodiment, each memory block 330 may further include a plurality of NAND strings 340 each extending in a second direction and a third direction. For example, the second direction crosses the first direction, and the third direction is perpendicular to a plane defined by the first and second directions. Each of the NAND strings NS may be coupled to a bit line BL, at least one drain selection line DSL, at least one source selection line SSL, a plurality of word lines WL0 to WLn-1, at least one dummy word line (not shown), and a common source line CSL, and each of the NAND strings NS may include a plurality of transistor structures.

Thus, each memory block 330 of the memory device 150 may be coupled to a plurality of bit lines BL0 to BLm-1, one or more drain selection lines DSL, one or more source selection lines SSL, a plurality of word lines WL0-WL1, a plurality of dummy word lines (not shown), and one or more common source lines CSL, and each memory block 330 may include a plurality of NAND strings NS. Also, in each memory block 330, a single bit line BL may be coupled to a plurality of NAND strings NS to realize a plurality of transistors in a single NAND string NS. Also, a drain select transistor DST of each NAND string NS may be coupled to a corresponding bit line BL, and a source select transistor SST of each NAND string NS may be coupled to a common source line CSL. Memory cells MC0 to MCn-1 may be provided between the drain select transistor DST and the source select transistor SST of each NAND string NS. In other words, a plurality of memory cells may be realized in each memory block 330 of the memory device 150.

Figure 3:
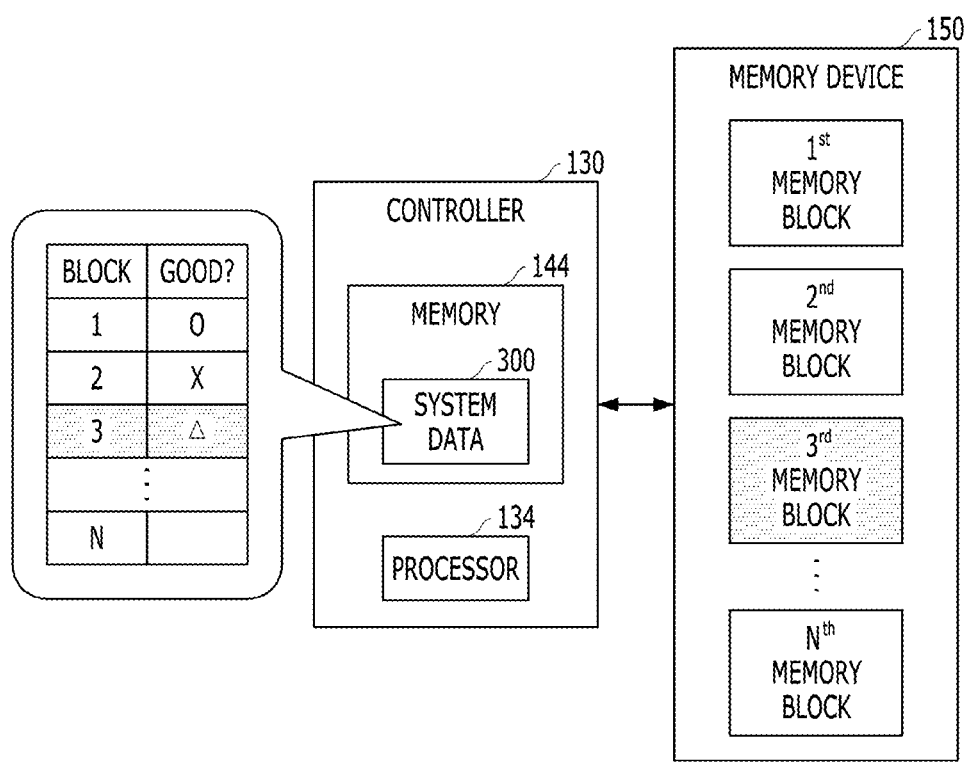
FIG. 3 is a block diagram illustrating a memory system in accordance with an embodiment of the present disclosure.

FIG. 3 is a block diagram illustrating a memory system (e.g., the memory system 110 in FIG. 1) in accordance with an embodiment of the present disclosure. In particular, FIG. 3 shows information about a plurality of memory blocks of the memory device 150, and the information is included in the system data 300 stored in the memory 144.

The system data 300 may be data utilized for the memory system 110 to perform system operations. The system data 300 may include configuration information, super block information, and bad block information, map information, and read count information of the memory device 150.

The configuration information of the memory device 150 may include the number of dies included in the memory device 150, the number of channels, the number of planes, the number of blocks, and the number of pages. The super block information may be information that indicates one or more super blocks. The super block information may include information on the blocks which are currently used for a super block and blocks which are not used for a super block. The bad block information may be information indicating one or more bad blocks currently included in the memory device 150. The map information may be information indicating the location of a map which is currently stored in the memory device 150.

The controller 130 may load the system data 300 from the memory device 150 and store the loaded data in the memory 144. To be specific, when the memory system is booted, the controller 130 may load the system data 300 from the memory device 150. The controller 130 may internally update the system data 300 with a change while the system is being operated. The controller 130 may then provide an update request to the memory device 150 along with the updated system data 300. According to the update request and updated system data 300 that are provided from the controller 130, the memory device 150 may process the previously stored system data in the memory device 150 as invalid data and process the newly provided updated system data 300 as valid data.

As illustrated in FIG. 1, the controller 130 may read or write data by using a plurality of memory blocks included in the memory device 150. When a read operation or a write operation is repeatedly performed, a bad memory block which is a memory block in a bad state may occur among a plurality of memory blocks. A bad memory block may be a memory block in which a data is not normally stored, or a memory block in which failure bits are detected to be higher than a predetermined threshold value during a read operation. The state of the memory block, which is supposed to store data in its integrity, may significantly affect the performance of the overall system. Accordingly, the memory system 110 may continuously manage a plurality of memory blocks.

Referring to FIG. 3, bad block information among the information included in the system data 300 is shown. In FIG. 3, a first memory block among the plurality of memory blocks included in the memory device 150 may be represented by 'O', and a second memory block may be represented by 'X'. The first memory block may be a normal memory block, and the second memory block may be a bad memory block. The third memory block may be represented by 'Δ', which indicates that the third memory block is a memory block (hereinafter, referred to as a candidate memory block) requiring management.

The processor 134 may monitor the states of all the memory blocks included in memory device 150, and store the state of each of the memory blocks in the memory 144, or the memory device 150, or both, as the system data 300.

The candidate memory block may include any one of a memory block that has not been read or written for a relatively long time, a memory block that has not been in a good condition from the beginning due to the physical characteristics of the memory device 150, and a memory block on which erase operations are performed more than a given number of times. The candidate memory block may be determined by the processor 134. The processor 134 may then monitor one or more candidate memory blocks, and update and store the states of the respective candidate memory blocks.

The controller 130 may use only normal memory blocks based on the system data 300 and may not use bad memory blocks. In order to determine whether or not each of the candidate memory blocks is usable, the processor 134 in the controller 130 may perform a test read operation on the candidate memory blocks.

The test read operation may include an operation of reading data stored in the candidate memory block and an operation of decoding the read data. When the decoding result shows that the number of failure bits is equal to or greater than a predetermined threshold value, the processor 134 may determine the candidate memory block as a bad memory block. On the other hand, when the number of failure bits is smaller than the predetermined threshold value, the processor 134 may determine the candidate memory block as a normal memory block.

The processor 134 may perform a test read operation on a candidate memory block for a predetermined time. For example, the processor 134 may perform a test read operation on the candidate memory block while being booted.

Ideally, a test read operation may be performed on the entire candidate memory blocks for a predetermined time. However, as described earlier, the number of candidate memory blocks may increase over time. Also, a read operation and a decoding operation for the candidate memory blocks may not be performed properly due to various internal system conditions. As a result, the test read operation may be performed on some candidate memory blocks rather than the entire candidate memory blocks.

To address this issue, the processor 134 may perform a test read operation while flexibly adjusting a method of performing a test read operation, a test read method.

The processor 134 may perform a test read operation by reading only some of the word lines in a candidate memory block. The processor 134 may then determine the number of word lines to be scanned in the test read operation.

Also, the processor 134 may determine the test operation method based on the number of scanned candidate memory blocks. The processor 134 may count the number of current candidate memory blocks and store the counted number in the memory 144 and the memory device 150. The processor 134 may count the number of the scanned candidate memory blocks during a first test operation.

The processor 134 may adjust the test read method of a test read operation to be performed later based on a pre-stored reference value and the number of currently scanned candidate memory blocks during a current test read operation (e.g., an $i^{th}$ test read operation). For example, the processor 134 may adjust one or more parameters of a subsequent test read operation (e.g., an $i+1^{th}$ test read operation) based on the reference value and the number of scanned candidate memory blocks during the current test read operation. The pre-stored reference value may be an initial value which is set by a user, or the number of scanned candidate memory blocks during a previous test read operation (e.g., an immediately preceding $i-1^{th}$ test operation).

When the number of the currently scanned candidate memory blocks is equal to or greater than the reference value, the processor 134 may adjust the test read method to perform a test read operation by raising the number of word lines in a candidate memory block to be higher than the current value when the next test operation is performed. Specifically, when the number of scanned candidate memory blocks in the current $i^{th}$ test read operation is equal to or greater than the reference value, the processor 134 reduces the number of scanned candidate memory blocks in a subsequent $i+1^{th}$ test read operation compared to that in the current $i^{th}$ test read operation. Thus, the number of word lines read in each of the scanned candidate memory blocks in the subsequent $i+1^{th}$ test read operation may be increased to become greater than that in the current $i^{th}$ test read operation. In an embodiment, the number of word lines read in each of the scanned candidate memory blocks in the subsequent $i+1^{th}$ test read operation may be increased from that in the current $i^{th}$ test read operation by a predetermined number. For example, when the processor 134 has performed a test operation for 10 word lines in the candidate memory block during the $i^{th}$ test operation, when the next $i+1^{th}$ test operation is performed, the processor 134 may adjust the test read method to perform a test read operation for 15 word lines in the candidate memory block. In an embodiment, the predetermined number is obtained based on a difference between the number of scanned candidate memory blocks in the current $i^{th}$ test read operation and the reference value. For example, the number of scanned candidate memory blocks during the subsequent $i+1^{th}$ test read operation may decrease from that in the current $i^{th}$ test read operation by a first number that is proportional to the difference between the number of scanned candidate memory blocks in the current $i^{th}$ test read operation and the reference value. A product of the number of scanned candidate memory blocks and the number of word lines read in each of the scanned candidate blocks in the current $i^{th}$ test read operation may be equal to that in the subsequent $i+1^{th}$ test read operation. Thus, when the number of scanned candidate memory blocks decreases, the number of word lines read in each of the scanned candidate memory blocks may increase. As a result, the number of word lines read in each of the scanned candidate memory blocks in the subsequent $i+1^{th}$ test read operation may increase from that in the current $i^{th}$ test read operation by a second number that is proportional to the first number. When a test read operation is performed for more word lines, the processor 134 may determine the state of the candidate memory block more accurately.

On the other hand, when the number of the currently scanned candidate memory blocks is smaller than the reference value, the processor 134 may adjust the test read method to perform a test read operation for the word lines whose number in the candidate memory block is smaller than the current number of word lines in the next test operation. Specifically, when the number of scanned candidate memory blocks in the current $i^{th}$ test read operation is less than the reference value, the processor 134 increases the number of scanned candidate memory blocks in a subsequent $i+1^{th}$ test read operation compared to that in the current $i^{th}$ test read operation. Thus, the number of word lines read in each of the scanned candidate memory blocks in the subsequent $i+1^{th}$ test read operation may be decreased to become smaller than that in the current $i^{th}$ test read operation. In an embodiment, the number of word lines read in each of the scanned candidate memory blocks in the subsequent $i+1^{th}$ test read operation may be decreased from that in the current $i^{th}$ test read operation by a predetermined number. For example, when the processor 134 has performed a test operation for 10 word lines in the candidate memory block during the $i^{th}$ test operation, the processor 134 may adjust the test read method to perform a test read operation for five word lines in the candidate memory block during the next $i+1^{th}$ test operation. In an embodiment, the predetermined number is obtained based on a difference between the reference value and the number of scanned candidate memory blocks in the current $i^{th}$ test read operation. For example, the number of scanned candidate memory blocks during the subsequent $i+1^{th}$ test read operation may increase from that in the current $i^{th}$ test read operation by a third number that is proportional to the difference between the reference value and the number of scanned candidate memory blocks in the current $i^{th}$ test read operation. A product of the number of scanned candidate memory blocks and the number of word lines read in each of the scanned candidate blocks in the current $i^{th}$ test read operation may be equal to that in the subsequent $i+1^{th}$ test read operation. Thus, when the number of scanned candidate memory blocks increases, the number of word lines read in each of the scanned candidate memory blocks may decrease. As a result, the number of word lines read in each of the scanned candidate memory blocks in the subsequent $i+1^{th}$ test read operation may decrease from that in the current $i^{th}$ test read operation by a fourth number that is proportional to the third number. When a test read operation is performed for fewer word lines, the processor 134 may scan more candidate memory blocks.

Figure 4:
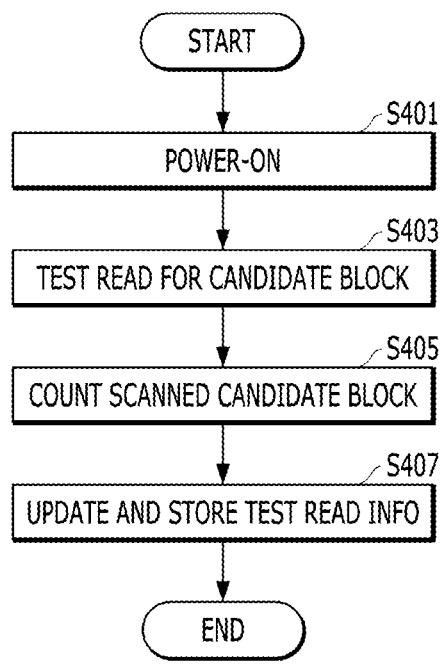
FIG. 4 is a flowchart describing an operation of a memory system in accordance with an embodiment of the present disclosure.

FIG. 4 is a flowchart describing an operation of a memory system (e.g., the memory system 110 in FIG. 1) in accordance with an embodiment of the present disclosure. In particular, FIG. 4 shows a test read operation performed by the memory system 110.

At step S401, the memory system 110 may be powered on. When the memory system 110 is powered on, a controller (e.g., the controller 130 in FIG. 1) may read system data (e.g., the system data 300 in FIG. 3) stored in a memory device (e.g., the memory device 150 in FIG. 3) from the memory device 150 and store the read system data 300 in a memory (e.g., the memory 144 in FIG. 3).

At step S403, the processor 134 may perform a test read operation on a candidate memory block based on the bad block information included in the system data 300. Further, the processor 134 may perform a test read operation according to a previously determined test read method.

At step S405, the processor 134 may count the number of scanned candidate memory blocks to perform a test read operation for a predetermined time.

In step S407, the processor 134 may compare the number of the currently scanned candidate memory blocks with a pre-stored reference value and adjust the test read method (or test read information). The processor 134 may then update or store the adjusted test read method in the memory 144 and the memory device 150.

In this manner, the processor 134 may efficiently perform a test read operation while flexibly adjusting the test read method based on the number of the scanned candidate memory blocks.

Figure 5:
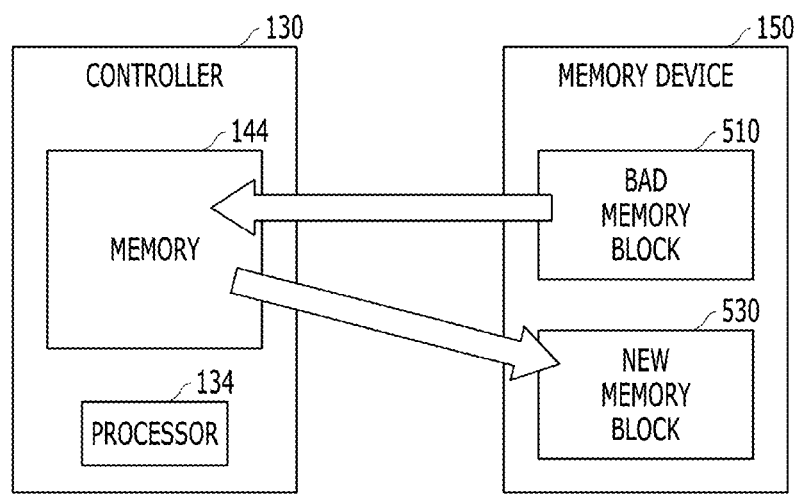
FIG. 5 is a conceptual diagram illustrating an operation of a memory system in accordance with an embodiment of the present disclosure.

FIG. 5 is a conceptual diagram illustrating an operation of a memory system (e.g., the memory system 110 in FIG. 1) in accordance with an embodiment of the present disclosure.

As a result of the test read operation, the processor 134 may detect a bad memory block among the candidate memory blocks. To be specific, as a result of the test read operation, the processor 134 may determine a candidate memory block including failure bits the number of which is smaller than a predetermined threshold value as a normal memory block. On the other hand, the processor 134 may determine a candidate memory block including failure bits the number of which is equal to or greater than the predetermined threshold value as a bad memory block.

The processor 134 may perform a reclaim operation on a memory block which is determined as a bad memory block (e.g., a bad memory block 510).

To be specific, the processor 134 may read data stored in the bad memory block 510 and store the read data in the memory 144. The processor 134 may then transfer the stored data in the memory 144 to a new memory block 530 and store the transferred data in the new memory block 530.

In order to increase the reliability of the data stored in a bad memory block, the memory system 110 may determine the state of each of the memory blocks, perform a test read operation, and store data in normal memory blocks, which may lead to improved system performance.

According to the above-described embodiments of the present disclosure, the memory system may efficiently perform a test read operation on the memory blocks. Specifically, a memory system according to an embodiment of the present disclosure may compare the number of scanned candidate memory blocks in a current test read operation with a reference value, and dynamically adjust the number of scanned candidate memory blocks and the number of word lines read in each of the scanned candidate memory blocks in a subsequent test read operation based on the comparison result. As a result, such a memory system may be optimized to realize a trade-off between the number of scanned candidate memory blocks and the number of word lines read in each of the scanned candidate memory blocks in performing a test read operation, thereby ensuring increased block coverage as well as increased accuracy of detecting bad blocks during the test read operation compared to a conventional memory system.

While the present disclosure has been described with respect to the specific embodiments, various changes and modifications may be possible.

What is claimed is:

1. A memory system, comprising:
a memory device; and
a controller suitable for performing a first test read operation on a first plurality of candidate memory blocks, determining a test read method of a second test read operation based on a reference value and a first number of the first plurality of candidate memory blocks scanned in the first test read operation, and performing the second test read operation on a second plurality of candidate memory blocks based on the determined test read method.

2. The memory system of claim 1, wherein:
a second number is the number of the second plurality of candidate memory blocks, a first plurality of word lines are read in each of the first plurality of candidate memory blocks in the first test read operation, a third number being the number of the first plurality of word lines, and a second plurality of word lines are read in each of the second plurality of candidate memory blocks in the second test read operation, a fourth number being the number of the second plurality of word lines; and
when the first number of the first plurality of candidate memory blocks scanned in the first test read operation is equal to or greater than the reference value, the controller performs the second test read operation by scanning the second plurality of word lines, the fourth number of the second plurality of word lines being obtained by adding a predetermined number to the third number of the first plurality of word lines read in the first test read operation.

3. The memory system of claim 1, wherein:
a second number is the number of the second plurality of candidate memory blocks, a first plurality of word lines are read in each of the first plurality of candidate memory blocks in the first test read operation, a third number being the number of the first plurality of word lines, and a second plurality of word lines are read in each of the second plurality of candidate memory blocks in the second test read operation, a fourth number being the number of the second plurality of word lines; and
wherein, when the first number of the first plurality of candidate memory blocks scanned in the first test read operation is smaller than the reference value, the controller performs the second test read operation by scanning the second plurality of word lines, the fourth number of the second plurality of word lines being obtained by subtracting a predetermined number from the third number of the first plurality of word lines read in the first test read operation.

4. The memory system of claim 1, wherein a second number is the number of the second plurality of candidate memory blocks, and
wherein the controller counts and stores a third number of a third plurality of candidate memory blocks of the memory device scanned in a third test read operation, the third test read operation preceding the first test read operation, the third number being the reference value, the controller counts and stores the first number of the first plurality of candidate memory blocks scanned in the first test read operation, and the controller counts and stores the second number of the second plurality of candidate memory blocks scanned in the second test read operation.

5. The memory system of claim 1, wherein the controller determines one or more candidate memory blocks based on system data including bad block information.

6. The memory system of claim 5, wherein the controller stores the system data in the memory device.

7. The memory system of claim 1, wherein the controller determines a candidate memory block as a bad memory block when the candidate memory block includes failure bits, a second number being the number of the failure bits, and the second number is equal to or greater than a predetermined threshold value.

8. The memory system of claim 7, wherein the controller performs a reclaim operation on the bad memory block.

9. The memory system of claim 1, wherein the controller determines a candidate memory block as a normal memory block when the candidate memory block includes failure bits, a second number being the number of the failure bits, and the second number is smaller than a predetermined threshold value.

10. The memory system of claim 1, wherein the controller stores the determined test read method a memory and the memory device.

11. A method for operating a memory system, comprising:
counting a first number of a first plurality of candidate memory blocks scanned in a first test read operation;
determining a test read method of a second test read operation based on a reference value and the first number of the first plurality of candidate memory blocks scanned in the first test read operation; and
performing the second test read operation on a second plurality of candidate memory blocks based on the determined test read method.

12. The method of claim 11, wherein:
a second number is the number of the second plurality of candidate memory blocks, a first plurality of word lines are read in each of the first plurality of candidate memory blocks in the first test read operation, a third number being the number of the first plurality of word lines, and a second plurality of word lines are read in each of the second plurality of candidate memory blocks in the second test read operation, a fourth number being the number of the second plurality of word lines; and
determining of the test read method comprises, when the first number of the first plurality of candidate memory blocks scanned in the first test read operation is equal to or greater than the reference value, obtaining the fourth number of the second plurality of word lines by adding a predetermined number to the third number of the first plurality of word lines read in the first test read operation.

13. The method of claim 11, wherein:

a second number is the number of the second plurality of candidate memory blocks, a first plurality of word lines are read in each of the first plurality of candidate memory blocks in the first test read operation, a third number being the number of the first plurality of word lines, and a second plurality of word lines are read in each of the second plurality of candidate memory blocks in the second test read operation, a fourth number being the number of the second plurality of word lines; and determining the test read method comprises, when the first number of the first plurality of candidate memory blocks scanned in the first test read operation is smaller than the reference value, obtaining the fourth number of the second plurality of word lines by subtracting a predetermined number from the third number of the first plurality of word lines read in the first test read operation.

14. The method of claim 11, wherein a second number is the number of the second plurality of candidate memory blocks, the method further comprising:

storing a third number of a third plurality of candidate memory blocks scanned in a third test read operation, the third test read operation preceding the first test read operation, the third number being the reference value;

storing the first number of the first plurality of candidate memory blocks scanned in the first test read operation; and counting and storing the second number of the second plurality of candidate memory blocks scanned in the second test read operation.

15. The method of claim 11, further comprising:

determining one or more candidate memory blocks based on system data including bad block information.

16. The method of claim 15, wherein the memory system includes a memory device, the method further comprising:

storing the system data in the memory device.

17. The method of claim 11, further comprising:

determining a candidate memory block as a bad memory block when the candidate memory block includes failure bits, a second number being the number of the failure bits, and the second number is equal to or greater than a predetermined threshold value.

18. The method of claim 17, further comprising:

performing a reclaim operation on the bad memory block.

19. The method of claim 11, further comprising:

determining a candidate memory block as a normal memory block when the candidate memory block includes failure bits, a second number being the number of the failure bits, and the second number is smaller than a predetermined threshold value.

20. The method of claim 11, wherein the memory system includes a memory device and a memory, the method further comprising:

storing the determined test read method in the memory and the memory device.

\* \* \* \* \*